United States Patent [19]

Masterton et al.

[11] Patent Number: 4,731,796

[45] Date of Patent: Mar. 15, 1988

[54] MULTI-MODE RADIO TRANSCEIVER

[75] Inventors: John Masterton, Bishop's Stortford; Peter A. Ramsdale, Saffron Walden, both of England

[73] Assignee: STC, plc, London, England

[21] Appl. No.: 64,240

[22] Filed: Jun. 19, 1987

Related U.S. Application Data

[63] Continuation-in-part of Ser. No. 790,606, Oct. 23, 1985, abandoned.

[51] Int. Cl.⁴ .............................................. H04B 1/38
[52] U.S. Cl. ........................................ 375/9; 375/43; 455/73; 455/93; 455/142; 455/84
[58] Field of Search ..................... 375/39, 42, 46, 75, 375/76, 77, 79, 118, 119, 9, 43; 329/131, 132, 133, 135; 455/304, 305, 73, 93, 142, 84; 307/511, 512; 328/168; 370/11

[56] References Cited

U.S. PATENT DOCUMENTS

| | | | |
|---|---|---|---|
| 3,995,224 | 11/1976 | Sutphin, Jr. | 328/168 |
| 4,131,856 | 12/1978 | Chapman | 375/118 |
| 4,339,727 | 7/1982 | Kage et al. | 375/76 |
| 4,370,749 | 1/1983 | Levy et al. | 375/119 |
| 4,408,352 | 10/1983 | Dudding | 455/305 |
| 4,470,147 | 9/1984 | Goatcher | 375/77 |
| 4,583,239 | 4/1986 | Vance | 375/77 |

FOREIGN PATENT DOCUMENTS

1530602 11/1978 United Kingdom .
1556087 11/1978 United Kingdom .

Primary Examiner—Benedict V. Safourek
Assistant Examiner—Andrew J. Telesz, Jr.
Attorney, Agent, or Firm—Dennis P. Clarke

[57] ABSTRACT

A multi-mode radio transceiver comprising a sequence of bi-directional circuit modules including a radio frequency input/output amplifier module (1), a radio frequency/baseband I and Q quadrature channel conversion module (2), an analogue/digital conversion module (3), a digital signal processor (4,5), and a digital signal input/output interface (6), with a control means (7) whereby for transmission a radio frequency signal is formed from analogue quadrature I and Q channel components of a digitized signal at baseband and translated to the radio transmission frequency and for reception the radio frequency signals are transformed into I and Q quadrature analogue components at baseband and subsequently digitized.

2 Claims, 12 Drawing Figures

MULTI-MODE RADIO TRANSCEIVER

RELATED APPLICATION

This application is a continuation-in-part of application Ser. No. 790,606, filed Oct. 23, 1985 now abandoned.

FIELD OF THE INVENTION

This invention relates to a multi-mode radio transceiver having the capability to receive and transmit signals of amplitude, frequency, phase or mixed modulation formats.

DESCRIPTION OF RELATED ART

The development of radio circuits using the so-called "zero I.F." or "direct conversion" principles has enabled radio receivers to be constructed using integrated solid state circuitry, with virtually the entire r.f. portion of the receiver being incorporated in a single chip. British Pat. No. 1530602 (I.A.W. Vance-1) discloses a radio receiver structure, suitable for implementation as an integrated circuit, in which the received r.f. signals are mixed with a local oscillator signal at the carrier frequency to produce "in-phase (I)" and "quadrature (Q)" baseband signals. Demodulation can then be performed in a number of ways, one of which is by using a digital signal processor (DSP) in a manner similar to that disclosed in U.S. Pat. No. 4,470,147 (Goatcher). The filtered analogue quadrature signals are converted to digital signals and processed digitally to reproduce the original modulating signal according to whether the transmission modulation was am, fm or pm. In a variant on the basic direct conversion principle for single sideband modulation the mixing frequency is the side band centre frequency instead of the carrier frequency.

SUMMARY OF THE INVENTION

According to the present invention there is provided a multi-mode radio transceiver comprising a sequence of bi-directional circuit modules including a radio frequency input/output amplifier module, a radio frequency/baseband I and Q quadrature channel conversion module, an analogue/digital conversion module, a digital signal processor, and a digital signal input/output interface, with a control means whereby for transmission a radio frequency signal is formed from analogue quadrature I and Q channel components of a digitised signal at baseband and translated to the radio transmission frequency and for reception the radio frequency signals are transformed into I and Q quadrature analogue components at baseband and subsequently digitised.

An important feature in the successful implementation of a radio transceiver of this type is provision for automatic balancing of errors between the quadrature I and Q channels. Various forms of channel imbalance error can be balanced by a system of feedforward and feedback loops in the digital signal processor.

BRIEF DESCRIPTION OF THE DRAWINGS

Embodiments of the invention will now be described with reference to the accompanying drawings, in which:

FIGS. 5-7 illustrate various imbalance error correction arrangements.

DESCRIPTION OF THE PREFERRED EMBODIMENTS

Figure 1:
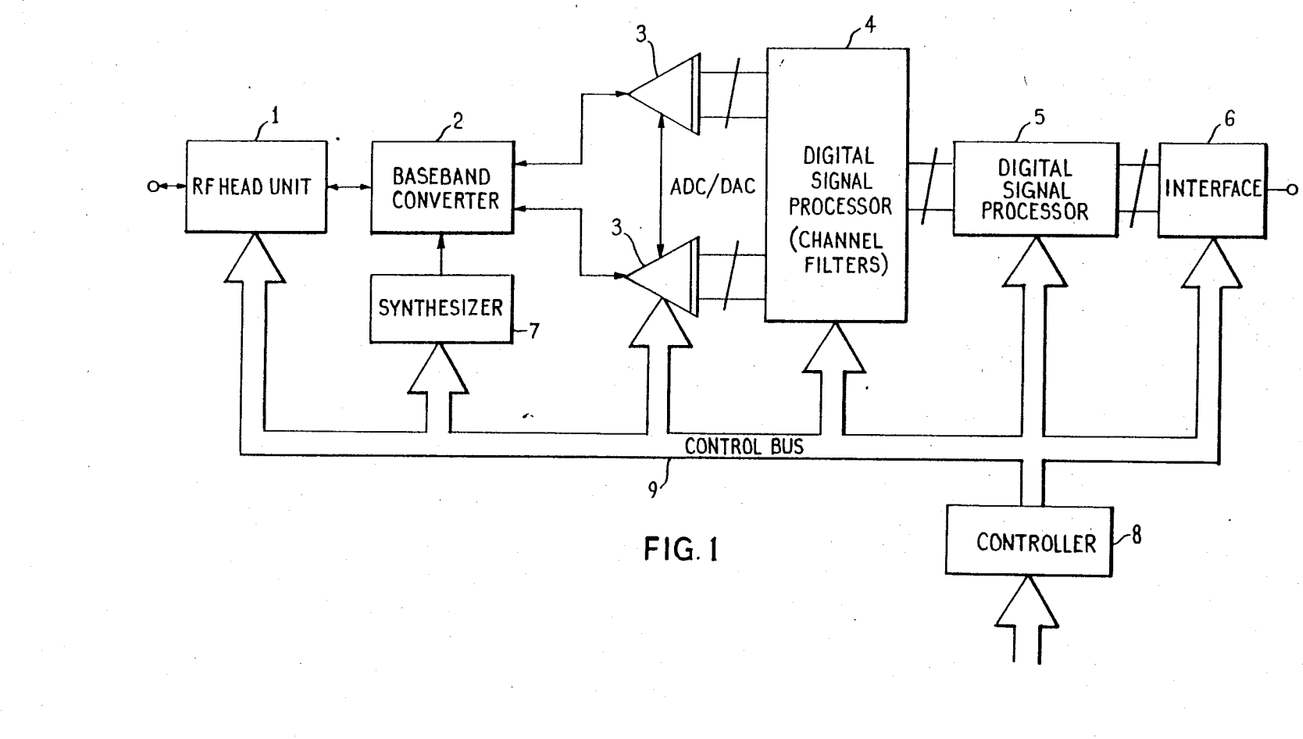
FIG. 1 shows a block schematic diagram of a multi-mode radio transceiver.

In the block diagram of a multi-mode radio transceiver shown in FIG. 1 there is a sequence of bi-directional circuit modules comprising a radio frequency head unit 1, a baseband converter 2, analogue/digital converters 3, a first digital signal processing stage 4, a second digital signal processing stage 5, and an interface 6. In addition there is a frequency synthesiser 7 and a controller 8 which is linked to the modules via a control bus 9. On reception signals are amplified in the RF head unit and presented to the baseband converter. The baseband converter contains two mixers which have either their local oscillator signals or RF input signals at 90° relative phase shift. The resulting quadrature baseband signals are then applied to the analogue to digital converters (ADCs). Up to this point in the radio the filtering may be minimal, merely protecting the RF circuitry from unwanted signals and preventing aliasing of frequencies by the ADCs. The digitised baseband signals are then passed to the DSPs which implement some or all of the following processes, as appropriate:

(i) Low pass channel filtering
(ii) Balancing of I- and Q- channels
(iii) Demodulation
(iv) Automatic gain control (AGC)

The AGC can be used to modify the gain of the RF head unit and baseband converter and internally within the DSP to adjust the digital samples.

The controller is the module which initiates changes in processing and pattern of operation of the other modules. The control bus passes instructions to each module. The controller may have a key-pad, switches or other entry device permitting manual selection of radio mode, functions etc., or be accessed by computer through an external interface. In response to user selection the controller (i) determines which programs (from its memory or the external interface) are appropriate
(ii) selects between embedded programs and switches within modules, and
(iii) sets switches to control signal flow between modules.

In all cases the information is passed through the control bus.

A further role of the controller is to initiate change in response to measurements from other modules. For example, on receipt of data from the digital signal processor the controller can amend programs and switches.

In particular, the controller 8 determines which programs are to be loaded into the digital signal processor 5, which channel filter, if any, is to be selected in the processor 4, which frequency is to be produced by the synthesizer 7 and what input/output characteristics are required of the RF head unit 1 and interface 6. The signals controlling these actions are sent via the bus structure 9 using well-known gating techniques.

It will be appreciated that bidirectional circuit units are much used in Telecommunications; some of these units are genuine bidirectional devices such as some converters which function as analogue-to-digital converters one way round and as digital-to-analogue converters the other way round. In other cases the bidirectional module is actually two devices in parallel, one of which is in circuit at a time, dependent on which direction of operation is in force. The decision as to which direction of operation is in force is enforced by the controller 8, FIG. 1, in response to, for instance, the "press-to-talk" button of a radio transceiver.

When the circuit shown in FIG. 1 has been set to the "transmit" condition the incoming speech or other modulation arrives at the interface module 6 and are thereby converted into a digital format which is then applied to processor 5. This, in conjunction with the processor 4, generates baseband I and Q signals which are applied to the two converters 3. These now function as digital to analogue converters to produce signals which form inputs to the baseband converter, which produce a modulated signal which is amplified in the RF head unit 1, and transmitted therefrom to a remote receiver.

Figure 2:
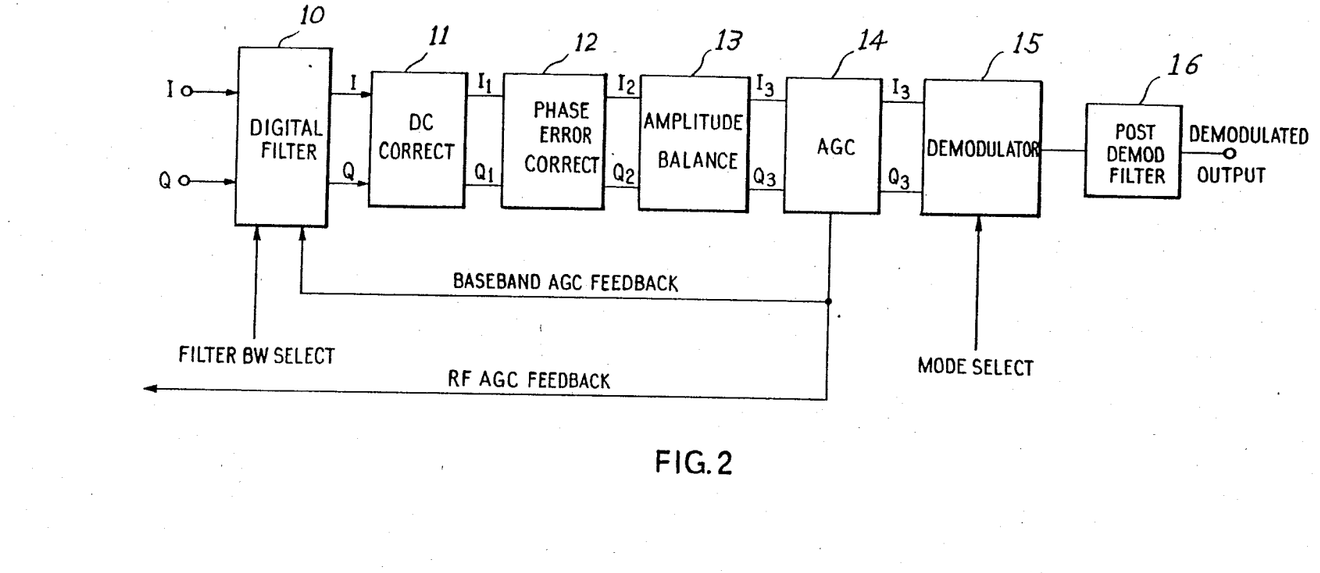
FIG. 2 illustrates functional elements of a digital signal processor operating in receive mode.

In the functional breakdown of the DSPs shown in FIG. 2, for the receive mode, the incoming I & Q quadrature channel signals are applied first to a digital filter 10. The filtered signals are then DC offset corrected (11), phase error corrected (12) and amplitude balanced (13). An automatic gain control (AGC) 14 is then applied before demodulation (15) is effected, e.g. in the manner disclosed in the above-identified U.S. Pat. No. 4,470,147 (Goatcher). Finally the demodulated signals are passed through a post-demodulation filter 16. Note that the AGC can be applied via feedback circuits, e.g. to either the digital filter 10 or possibly to the r.f. head unit 1. AGC can also be applied after the demodulation process, using a feed forward gain control loop. This is particularly useful when the AM demodulator according to the above-identified U.S. Pat. No. 4,470,147 (Goatcher) is used. Since demodulation is a software controlled digital process the choice of demodulation mode is effected by means of a mode programme selection in the processor 5 of FIG. 1.

Figure 3:
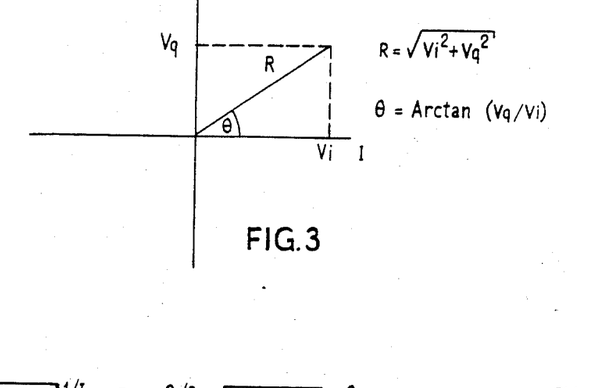
FIG. 3 illustrates conversion from rectangular to polar coordinates.
Figure 4:
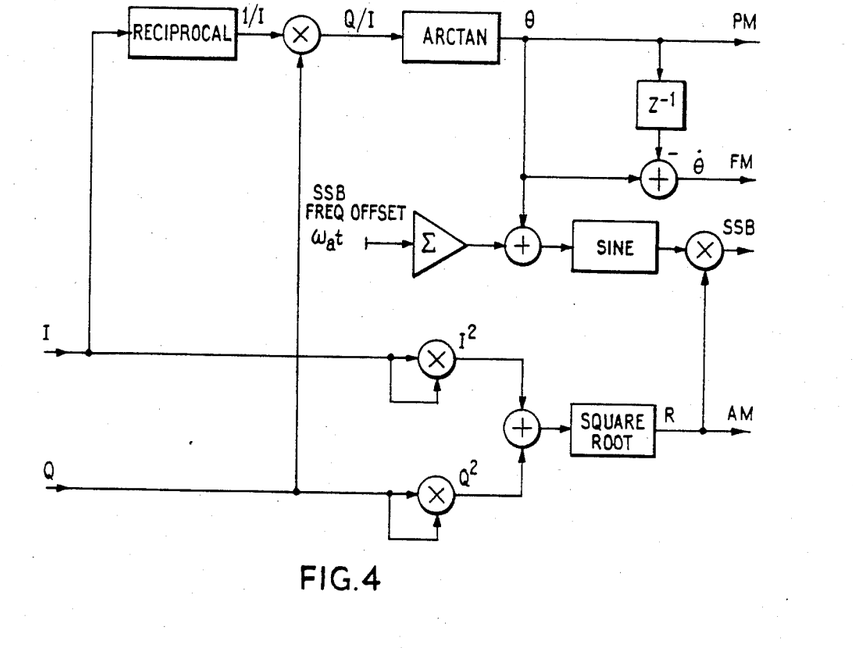
FIG. 4 illustrates a demodulation implementation.

To demodulate the signals from the I- and Q- channels, a conversion from rectangular to polar co-ordinates is required in the processor 5 of FIG. 1 and is carried out as indicated in FIG. 3. The particular modulation format is then decoded by using the amplitude (R), phase ($\theta$) or rate of change of phase ($\dot\theta$) information. The above-identified U.S. Pat. No. 4,470,147 (Goatcher) described a method for achieving this I-, Q-, to R, $\theta$ transformation. An alternative realisation is shown in FIG. 4 which corresponds to the processor 5 of FIG. 1 or the demodulator 15 of FIG. 2. This scheme has the advantage that the amplitude is found independently of phase. Thus R is not affected by phase errors and if only AM reception is required, then the demodulator can be simplified considerably. To realise either this scheme or that of the above-identified U.S. Pat. No. 4,470,147, a process equivalent to division is required. This may be carried out by finding a reciprocal (from a look-up table) and multiplying, or by finding logarithms (from a look-up table) and subtracting. For their realisation, the other mathematical operations shown (trigonometric identities, square roots, etc.) may be found either from look-up tables or from dedicated function modules. Automatic balancing of the I- and Q- channels is necessary for satisfactory demodulation in a practical system. The correction signals can be derived by comparing long term averages of the two channels. The DC offset, departures from quadrature phasing and differences in channel gains should all be corrected. Balance can be achieved by:

(i) Feedforward of exact error correction signal
(ii) Feedback of exact error correction signal
(iii) Feedback of steps based on direction of error
(iv) Feedback of random steps (or perturbations to minimise error signal)

Any form may be used for each correction and the corrections can be applied serially or in nested loops.

The circuit of FIG. 4 is a detection arrangement usable for detection from phase modulation (PM), frequency modulation (FM), amplitude modulation (AM) and single side band modulation (SSB). The operation in each case will be described briefly.

For PM, the I signal passes via a RECIPROCAL circuit which effectively inverts it to a multiplier to which Q is also applied. Hence the output of this multiplier is Q/I, and this is applied via an ARCTAN circuit to give an output $\theta$ which is the PM signal.

Much of the circuitry used for PM is also used for FM. Thus the ARCTAN output $\theta$ is applied directly to one input of a summator and via a $Z^{-1}$ block to the $-$ input of the summator to give an output designated $\dot\theta$, which is the FM signal.

We now consider the operation for AM. Here the I and Q signals are applied via squarers to give $I^2$ and $Q^2$ signals which are summated by a summator whose output $(I^2+Q^2)$ is applied to a square rooter, whose output R is the AM output.

To provide SSB demodulation, the side band mid frequency, referred to as SSB FREQ OFFSET $\omega_a t$, is applied via a summing circuit to one input of an adder to the other input of which is applied $\theta$, mentioned above. The sum output is then applied via a SINE block to one input of a multiplier to the other input of which is applied the output of the SQUARE ROOT block already mentioned. The output of the multiplier is the required SSB modulation.

As already indicated, the block RECIPROCAL, ARCTAN, SINE and SQUARE ROOT can be based on look-up table technology.

Thus the circuit has four outputs, and one only is effective at any one time dependent on what sort of modulation is being received. The choice of which output is effective is made from the controller in well-known manner.

Figure 5:
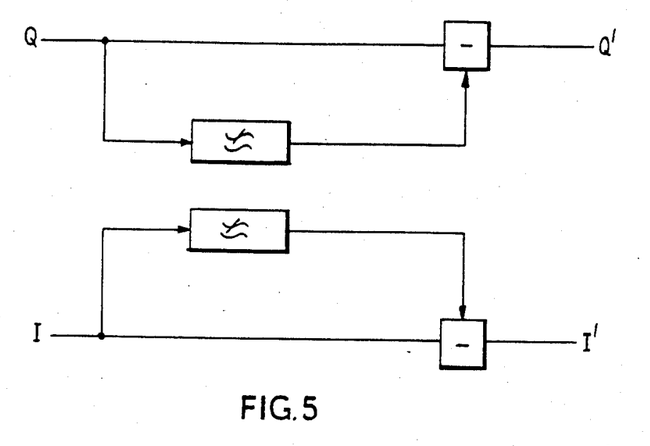
Figure 6A:
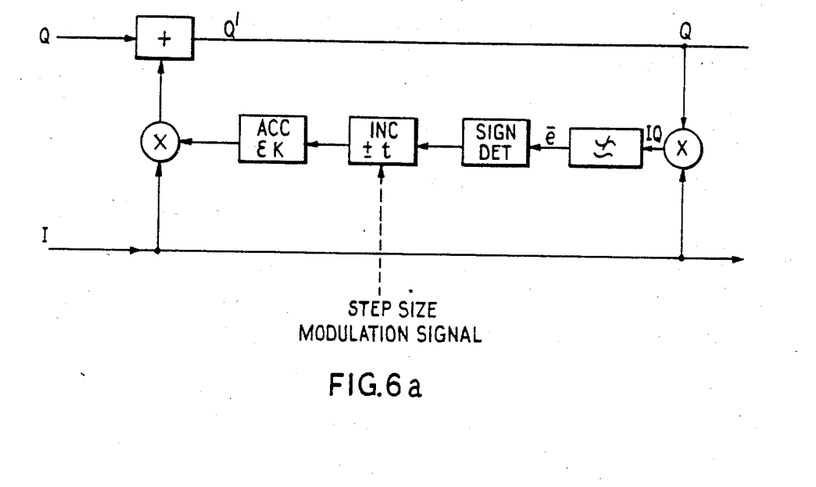

A possible overall balance chain was shown within FIG. 2. Possible detailed implementations of each balance are shown in FIGS. 5, 6 and 7. For DC offset, long term averaging removes all AC components and DC correction terms can be added or subtracted, as shown in FIG. 5. In the phase balance scheme of FIG. 6, the long term average of the product of the two channels is proportional to the phase imbalance error. Further mathematical operations on channel signals are required to find this error exactly. However, by using the sign of this error, positive or negative going steps can be generated. By applying these steps in a negative feedback loop, the channels move to a phase balance. With this scheme, a further measurement of the error magnitude (either exact or approximate), can provide a step size modulation signal giving large steps for rapid correction of big errors and small steps to minimise quantisation errors when balance is achieved. The phase balance circuit of FIG. 6a relies on a measure of phase imbalance, e, which is proportional to the phase offset. The accumulator Acc K sums the steps to provide the applied correction signal.

$$I = A \sin \theta \quad \text{reference}$$
$$Q = KA \cos(\theta + \delta) \quad \text{unbalanced channel with error } \delta$$
$$Q' = KA \cos \theta \quad \text{aim of correction}$$
expanding $Q = KA[\cos\theta \cos\delta - \sin\theta \sin\delta]$
using small angle approximation $\sin\delta \simeq \delta$
$$\cos\delta \simeq 1$$
$$= KA \cos\theta - \delta KA \sin\theta$$
$$Q = Q' - \delta K I$$
therefore $Q' = Q + \delta K I$
The correction factor
$$e = I \times Q$$
$$= KA^2 \sin\theta \cos(\theta + \delta)$$
$$= \frac{KA^2 [\sin 2\theta + \sin(-\delta)]}{2}$$

If this is filtered or averaged the sin2 term is removed, and using the small angle approximation:

$$e = \frac{-\delta KA^2}{2}$$

Thus, the sign of δK can be found from this term and the correct value accumulated in ACCεK by increment ±ε. So ε should be small to minimize imbalance quantised error, and ε should be large to rapidly correct large imbalances. The step size modulation can be provided to balance these requirements.

The application of step size modulation involves changing the value of INC+t (FIG. 6a). Several methods are possible. For example, if the sign of t remains unchanged over several samples, then the value of t can be progressively increased until the sign changes, at which time the value of t can be returned to its smallest size.

Figure 6B:
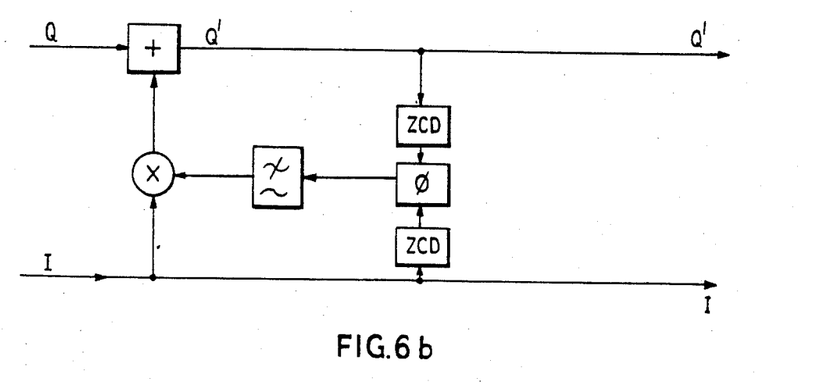

Alternative phase balance scheme is shown in FIG. 6(b). In this method, zero crossings in each channel are compared by a phase detector whose stable (zero) output occurs when there is a 90° phase difference between inputs. The filtered output from this detector can be directly applied as a correction signal, as shown. The zero crossings may be determined by zero-crossing detectors, or simple amplitude limiters may be used. In some cases it may be necessary to apply a weighting or scaling factor to the correction signal before it is used. The amplitude balance scheme of FIG. 7 feeds an exact correction signal forward. The long term averages of rectified channel signals are divided to produce the correction factor. By halving the I-channel signal, the correction factor becomes approximately ½. Restricting the result of the $E_I/E_Q$ division to fractional positive numbers considerably simplifies the realisation of this loop by a digital signal processor.

It will be seen that the balance operation in the four alternatives of FIG. 5, FIG. 6a, FIG. 6b and FIG. 7 are performed on the Q signal but not on the I signal. These tend to ensure that the correct relations are ensured between I and Q in respect of accuracy of quadrature and of relative amplitudes. These circuits would fill certain of the blocks in FIG. 2. Thus the arrangement of FIG. 5 can be used in block 11, that of FIG. 6a or 6b in block 12, and that of FIG. 7 in block 13.

Alternatively, the channel imbalances need not be considered specifically as offset, phase and amplitude (or gain) terms but as any error set of the correct order. A long term correlation of the two channel signals will mathematically yield a correction signal of appropriate order. This can be applied by a feedback or a feedforward technique.

For transmission the modules of FIG. 1 are used in the reverse direction to reception.

The interface 6 provides a digital signal from which the DSP's 4, 5 generate baseband I- and Q-channel signals. The baseband converter 2 of FIG. 1 converts the analogue I- and Q-channel signals from the DAC's into an RF signal for transmission by the RF head unit 1.

Possible arrangements for generating amplitude frequency, phase and single sideband modulation are shown in FIGS. 8, 9, 10 and 11, respectively. In each of these figures the circuitry to the left of the DAC's corresponds to the digital signal processing stages 4 and 5. The DAC's of FIGS. 8–11 are the DAC's of FIG. 1. All the circuitry to the right of the DAC's in FIGS. 8–11 corresponds to the baseband converter 2 of FIG. 1.

Figure 11:
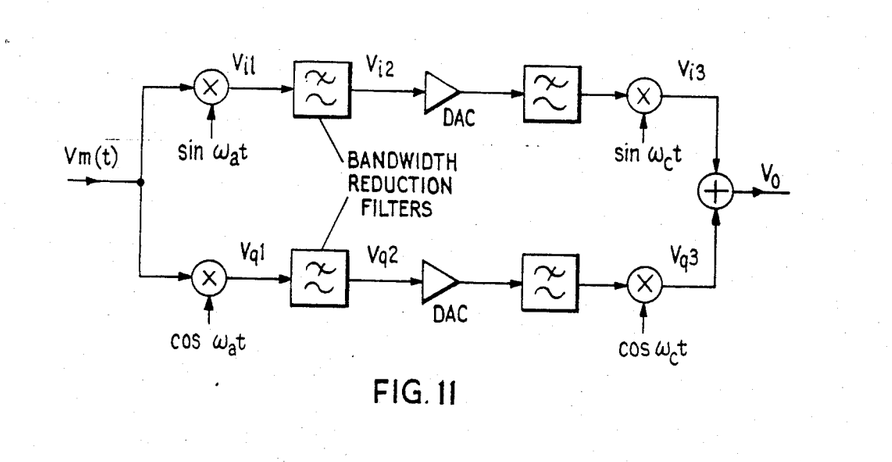

For AM (FIG. 8) only one channel signal (I) is required, the other channel (Q) is held at zero. A DC offset is added to the I digital message signal and the depth of modulation is determined by the relative channels levels $V_i$ and $V_{DC}$. After the digital I channel signal is converted to analogue form by the relevant DAC the analogue signal is converted to RF by mixing with the local oscillator signal $\sin\omega_c t$. In the FM arrangement of FIG. 9 the message signal $V_m$ is first integrated to give phase values. The baseband quadrature channel signals are then found from sine and cosine look-up tables. After the DAC's the I and Q signals are mixed in quadrature with carrier signals $\sin\omega_c t$ and $\cos\omega_c t$ and summed to produce the correct FM spectrum. For phase modulation (FIG. 10) the same steps as FM are required except that the digitised message signal is used directly as the phase value for the sine and cosine look up tables. In the arrangement of FIG. 11, SSB is generated by the Weaver method which is based on quadrature channel cancellations. Thus a complete set of modulation forms can be realised from the same basic architecture consisting of I- and Q-channel DSP baseband generators followed by quadrature baseband to RF mixers.

Figure 8:
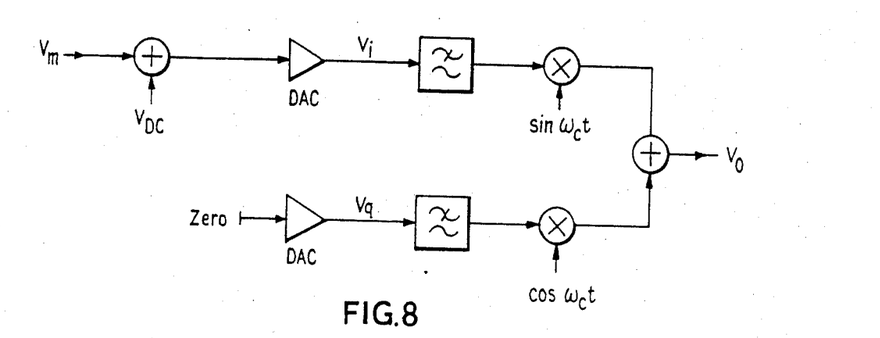
FIGS. 8-11 illustrate various modulation arrangements.
Figure 9:
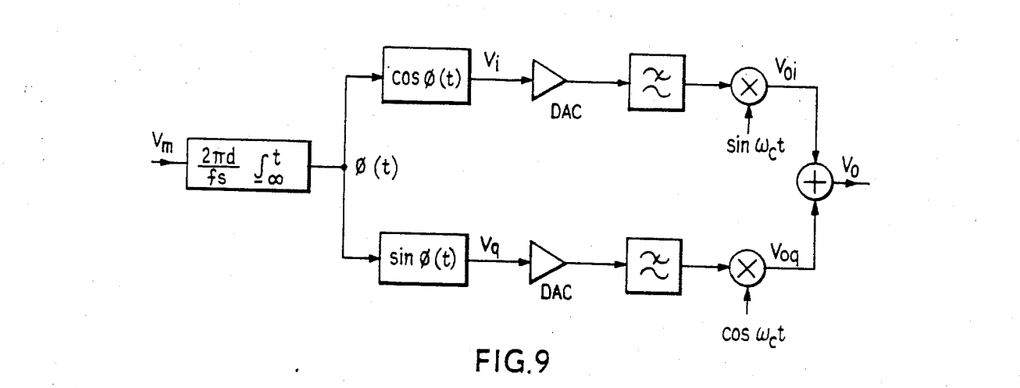
Figure 10:
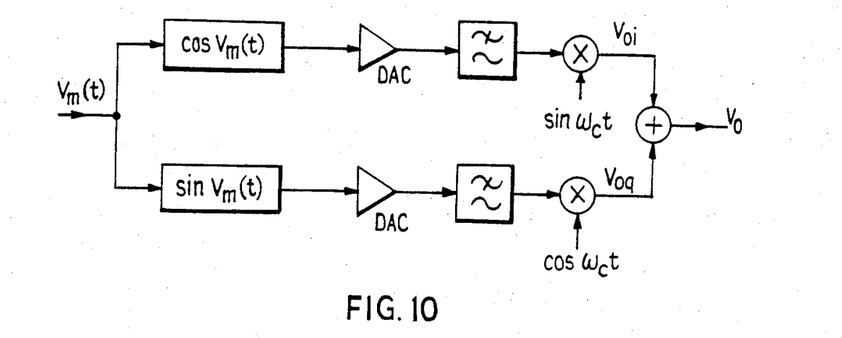

For its successful realisation, good balance is required between the I- and Q- channels. Balance corrections may be derived from a receiving measurement to estimate the imbalance on transmission (assuming reciprocity) or by feedback or feedforward loops based on the baseband converter output.

Where the transceiver is handling multi-mode traffic, i.e. where the signals have to be transmitted using more than one form of modulation, the interface 6 includes as "sub-modules" the appropriate circuits based on ones of FIGS. 8 and 9. In some cases it may be possible to use some elements in different forms of modulation. Thus the filters, multipliers and final adder will be seen to be common to all four of these circuits. Here again the choice between which circuits and parts of circuits are in use at any one time is enforced via the controller 8, in the same manner as the demodulator, FIG. 4, is controlled.

We claim:

1. A multi-mode radio transceiver comprising a sequence of bidirectional circuit modules including:
   (i) a radio frequency input/output module;
   (ii) a radio frequency/baseband I and Q quadrature conversion module;
   (iii) an analogue/digital conversion module;

(iv) a digital signal processor;
(v) a digital signal input/output interface; and
(vi) control means whereby for transmission a radio transmission frequency signal is formed from analogue quadrature I and Q channel components of a digitized signal at baseband and translated to the radio transmission frequency and for reception a radio reception frequency signal is transformed into received I and Q quadrature analogue components at baseband and subsequently digitized, and in the quadrature module:
(a) said I channel component is applied to a circuit which generates the I channel component reciprocal, which said reciprocal is applied to one input of a first multiplier to the other input of which said Q channel component is also applied;
(b) the first multiplier output Q/I is applied to an ARCTAN circuit whose output $\theta$ is a phase modulation version of the signal to which said I and Q channel components correspond;
(c) the ARCTAN output $\theta$ is applied directly to one input of a first adder to the other input of which $\theta$ is applied via a $Z^{-1}$ circuit, so that the output of the first adder is $\dot{\theta}$, which is a frequency modulation version of the signal to which said I and Q channel components correspond;
(d) said I and Q channel components are applied respectively to two squarers whose outputs are applied to a second adder the output of which is thus $(I^2+Q^2)$, which output is applied to a square root circuit whose output R is an amplitude modulation version of the signal to which said I and Q channel components correspond;
(e) for SSB the mid frequency of a sideband is applied to one input of a third adder via a summing circuit, the above-mentioned output $\theta$ being applied to the other input of the third adder, the output of the third adder being applied via a sine-generating circuit to one input of a second multiplier to the other input of which is applied the above-mentioned output R, such that the output of the second multiplier is an SSB modulation to which said I and Q channel components correspond, and
(f) wherein of the above PM, FM, AM, SSB outputs is enabled dependent on which form of modulation is being received.

2. A quadrature conversion module for use in a radio transceiver or receiver which responds to radio frequency signals received as I and Q quadrature analogue components, which said I and Q components may represent different modulation modes, wherein:
(a) said I and Q components are applied to circuit means which generate the function Q/I, which function is applied to an ARCTAN circuit whose output $\theta$ is a phase modulation version of the signal to which said I and Q components correspond;
(b) the ARCTAN output $\theta$ is applied directly to one input of a first adder to the other input of which $\theta$ is applied via a $Z^{-1}$ circuit, so that the output of the subtractor is $\dot{\theta}$, which is a frequency modulation version of the signal to which said I and Q components correspond;
(c) said I and Q components are also applied respectively to two squarers whose outputs are all applied to a second adder the output of which is thus $(I^2+Q^2)$, which output is applied to a square root circuit whose output R is an amplitude modulation version of the signal to which said I and Q components correspond;
(d) for SSB the mid-frequency of a sideband is applied to one input of a third adder via a summing circuit, the above-mentioned output $\theta$ being applied to the other input of the third adder, the output of the third adder being applied via a sine-generating circuit to one input of a multiplier to the other input of which is applied the above-mentioned output R, such that the output of the multiplier is an SSB modulation to which said I and Q components correspond; and
(e) wherein one of the above PM, FM, AM or SSB outputs is enabled dependent on which form of modulation is being received.

* * * * *